United States Patent [19]
Hsu et al.

[11] Patent Number: 5,910,912
[45] Date of Patent: Jun. 8, 1999

[54] FLASH EEPROM WITH DUAL-SIDEWALL GATE

[75] Inventors: Louis Lu-Chen Hsu, Fishkill; Chang-Ming Hsieh, Fishkill; Seiki Ogura, Hopewell Junction, all of N.Y.

[73] Assignee: International Business Machines Corporation, Armonk, N.Y.

[21] Appl. No.: 07/968,736

[22] Filed: Oct. 30, 1992

[51] Int. Cl.⁶ .................................................. G11C 16/04
[52] U.S. Cl. .............................. 365/185.01; 365/185.18; 257/321
[58] Field of Search .................................. 257/316, 321; 365/185, 185.01, 185.18

[56] References Cited

U.S. PATENT DOCUMENTS

| | | | |
|---|---|---|---|
| 4,794,565 | 12/1988 | Wu et al. | 365/185 |
| 4,931,847 | 6/1990 | Corda | 357/23.5 |
| 5,019,879 | 5/1991 | Chiu | 357/23.5 |
| 5,020,030 | 5/1991 | Huber | 257/316 |
| 5,041,886 | 8/1991 | Lee | 357/23.5 |
| 5,051,793 | 9/1991 | Wang | 357/23.5 |
| 5,095,344 | 3/1992 | Harari | 357/23.5 |
| 5,115,288 | 5/1992 | Manley | 357/23.5 |
| 5,153,854 | 10/1992 | Herold | 365/185 |

FOREIGN PATENT DOCUMENTS

| | | |
|---|---|---|
| 0197284 | 3/1985 | European Pat. Off. . |
| 0252027 | 6/1986 | European Pat. Off. . |
| 0335395 | 3/1988 | European Pat. Off. . |
| 4016346 | 8/1989 | Germany . |
| 62-43179 | 2/1987 | Japan . |

OTHER PUBLICATIONS

Mizutani et al., "A New EPROM Cell with a Side–Wall Floating Gate for High–Density and High–Performance Device", IEDM 1985, pp. 635–637.

Yamauchi et al., "A 5V–Only Virtual Ground Flash Cell with An Auxiliary Gate for High Density and High Speed Application", IEDM 1991, pp. 319–322.

*Primary Examiner*—David Nelms
*Assistant Examiner*—Hoai V. Ho

[57] ABSTRACT

An EEPROM cell includes a dual-gate transistor having a floating gate for storing the data and a select gate to access the cell, the two gates each being formed from poly sidewalls and being separated by a thin vertical oxide member that is formed by growing oxide on the vertical poly sidewalls of an aperture in which the select gate is formed, so that the final structure has dimensions that are less than those obtainable with optical lithography because both gates are sidewalls and therefore not limited to the dimensions achievable with optical lithography.

6 Claims, 7 Drawing Sheets

FLASH EEPROM WITH DUAL-SIDEWALL GATE

TECHNICAL FIELD

The field of the invention is that of electrically Erasable Programmable Read Only Memory chips (EEPROMs) having ultra high density with a cell size less than one square micrometer.

BACKGROUND ART

In the EEPROM art, it has long been sought to shrink the cell size in order to pack the cells more efficiently onto an integrated circuit chip. U.S. Pat. No. 5,041,886 illustrates an EEPROM cell for medium density (128K bits) in which a stacked floating gate-control gate system has an adjacent select gate that is formed from a polysilicon sidewall that is formed after both the floating gate and control gates are in place. This has the known advantage of reducing the size of the cell area because the sidewall will have a smaller area than the conventional stacked array. In this patent, the select gate and the control gate are controlled by the same word line.

An article by Yamauchi et al in the IEDM 91-319 entitled A 5V-Only Virtual Ground Flash Cell with an Auxiliary Gate for High Density and High Speed Operation discloses an EEPROM having a planar select gate adjacent to a sidewall floating gate.

SUMMARY OF THE INVENTION

The invention relates to an improved EEPROM cell suitable for 128 megabit memory chips, in which both the floating gate and the select gate are formed from polysilicon (poly) sidewalls, being separated only by a thin vertical oxide member that itself has been formed on the vertical edge of a polysilicon sidewall.

BEST MODE OF CARRYING OUT THE INVENTION

Figure 1:
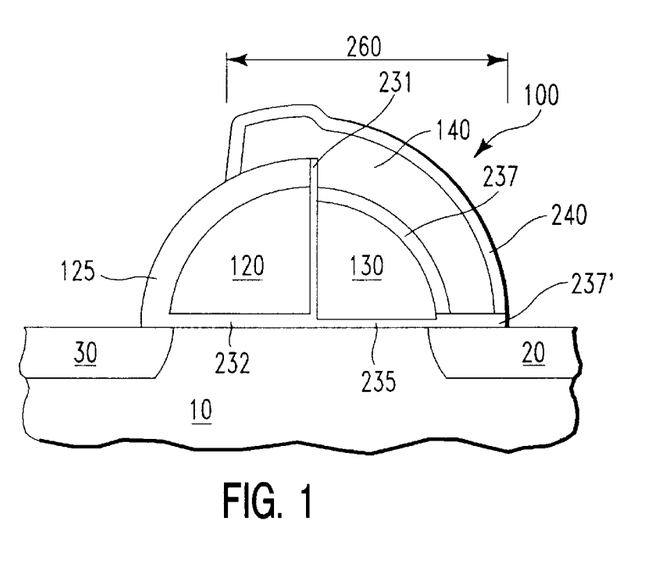
FIG. 1 gives a detailed cross-section of an embodiment of the invention.

Referring now to FIG. 1, there is shown in detail a dual-gate MOS transistor in which gate structure 100, comprising select gate 120, floating gate 130, and control gate 140, is disposed between source 30 and drain 20 formed in integrated circuit silicon substrate 10. On the left, select gate 120 serves the standard electrical function of permitting access to the cell. It has a vertical face, which was abutting the vertical face of a temporary support, and a second face opposite the vertical face. On the right, floating gate 130 contains stored charge that turns the transistor on or off, thereby permitting the existence of an electrical path between source 30 and drain 20 or blocking such a path, according to the stored charge within the gate. It also has a vertical face, which was abutting the vertical face of the vertical insulating member 230 in the middle of the structure, and a second face opposite the vertical face. On the top of the structure, control gate 140 serves to control the charge state of floating gate 130, as is known in the art.

An advantageous feature of the invention is that the only critical lithographic step is that illustrated by the arrow labeled 260, which indicates the dimension and location of control gate 140. The other dimensions, although smaller than dimension 260, do not require optical lithography but are done by the use of sidewall technology. In the center of the gate structure, vertical oxide member 230 separates the select gate from the floating gate. It has been formed by oxidizing the vertical surface of a poly sidewall (the select gate) after a temporary sidewall support layer of polysilicon that served as the foundation of the select gate sidewall has been removed. After the removal, a second sidewall (floating gate 130) is formed using vertical oxide member 230 as the vertical reference for the floating gate sidewall. The different types and thicknesses of oxide will be disclosed below.

Figure 2:
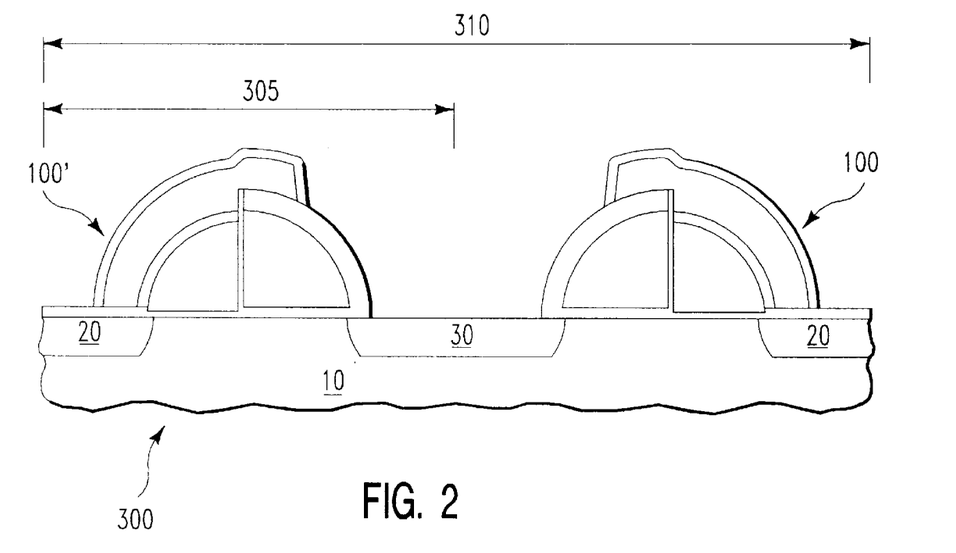
FIG. 2 illustrates a cross-section of a pair of memory cells according to the invention.

Referring now to FIG. 2, there is shown a cross-section of a pair of memory cells denoted generally by the numeral 300 and comprising two cell structures 100 and 100' that are mirror images of one another and are disposed on opposite sides of source 30, so that these two cells share a common source. The dimension of one cell is denoted by the arrow 305 and is illustratively 1.1 $\mu$m, with a channel length of 0.5 $\mu$m, a source width of 0.5 $\mu$m and a drain width of 0.5 $\mu$m or a layout ground rule of 0.5 $\mu$m. The width of a cell pair sharing a common source is denoted by the arrow 310.

Figure 3:
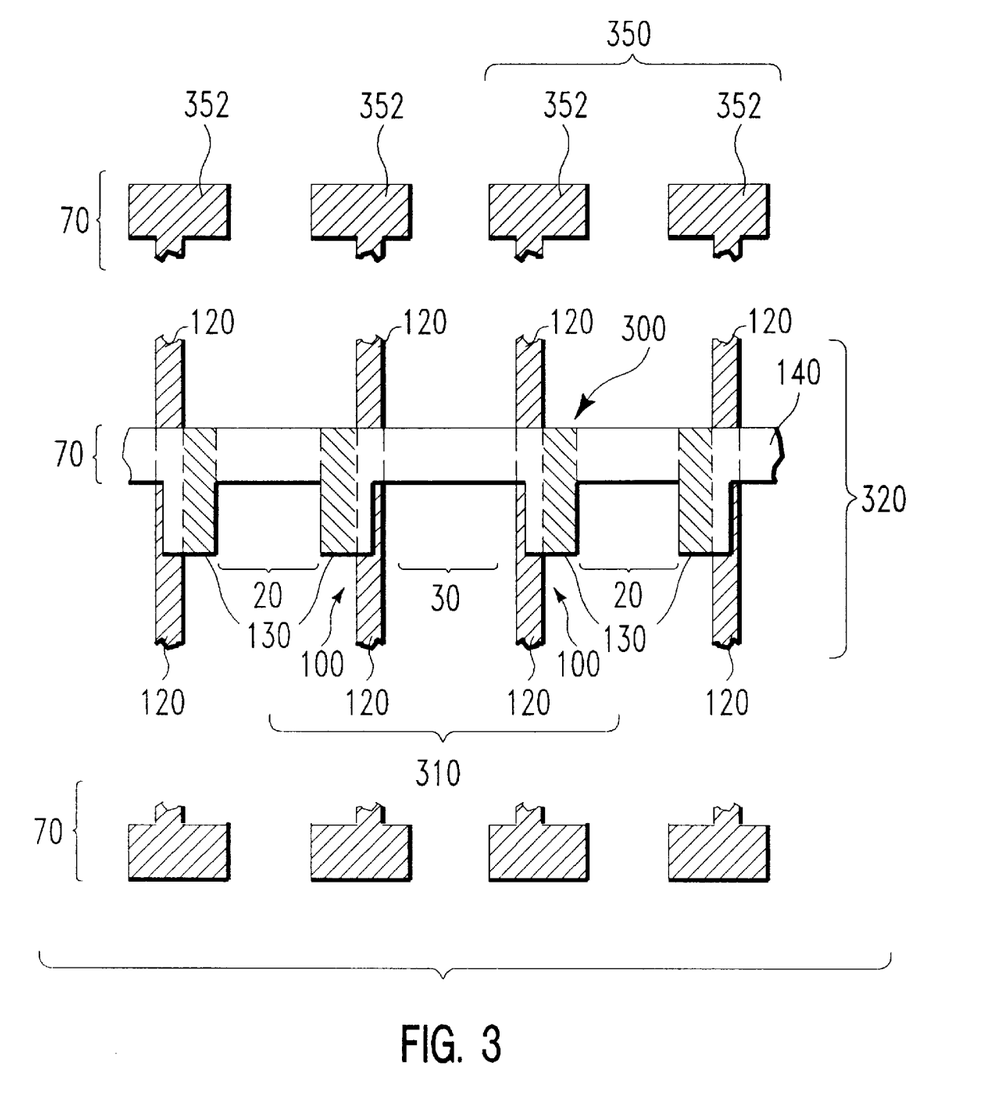
FIG. 3 gives a plan view of a portion of a memory array.

Referring now to FIG. 3, there is shown a plan view of a portion of a memory array constructed according to the invention in which the dimensions of a pair of cells 300 are shown by bracket 310 and bracket 320, the orthogonal coordinate on the right. In order to provide simplification in the drawing, some details have been suppressed. Counterpart elements in FIG. 3 are indicated by the same numerals as those in FIGS. 1 and 2. In the center of FIG. 3, source 30, denoted by a bracket, extends vertically in the drawing between the two gate select gates 120 (shown with cross hatching rising to the right). Floating gate 130 (having cross hatching rising to the left) is trimmed in the vertical direction in the drawing during the definition of control gate 140, since it is necessary for the floating gate to be isolated and it cannot connect adjacent cells. Control gate 140, which extends horizontally throughout the array (indicated by speckling) extends over gate 130 and over part of gate 120. On the left and right of the gate structures are formed two drains denoted by brackets labeled 20. On the left side of FIG. 3 are denoted brackets labeled with the numeral 70 which represent field oxides or shallow trench insulating areas. In the upper right hand corner is a bracket labeled 350 that indicates an area containing contacts for the vertical select gate lines 120 that are used to control access to an individual cell. This area will be shown in more detail in FIGS. 10 and 11. In a design alternative, contact pads of the select gates may be alternated between the top and bottom of the array in order to achieve higher packing density.

Figure 4:
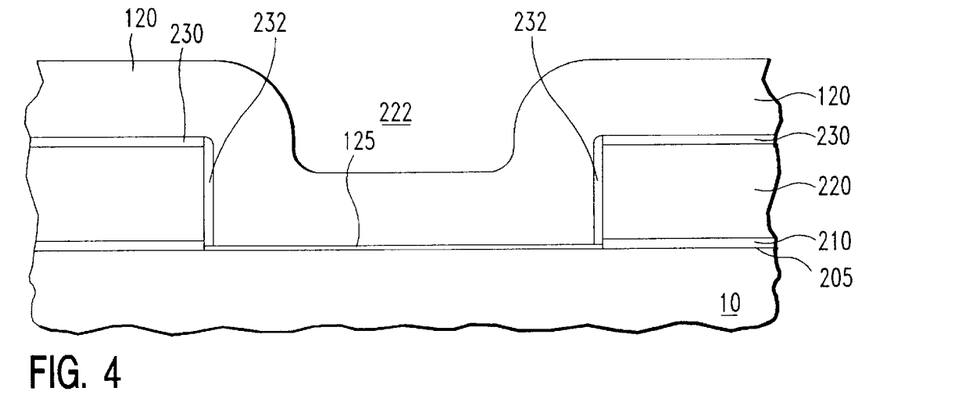
FIGS. 4 through 9 illustrate cross-sections of a cell in the course of fabrication.
Figure 10A:
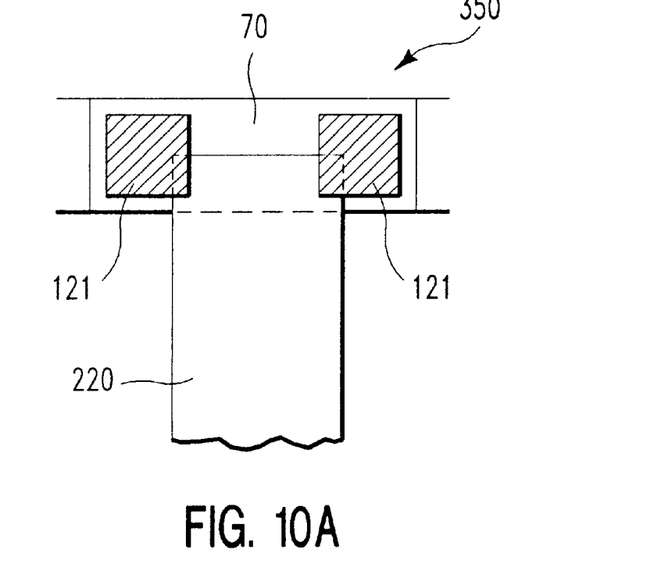
FIGS. 10A and 10B illustrate a plan view of an intermediate step.

A series of cross-sections of the process flow starts with FIG. 4, which shows the same area of cell 300 shown in FIG. 2 at an early stage in the process. Above substrate 10, a layer of pad oxide 205, having a nominal thickness of 12 nm, is followed by nitride 210, having a nominal thickness of 100 nm. A polysilicon or amorphous silicon layer 220 having a nominal thickness of 400 nm which will determine the height of the gate structure is deposited and patterned to form an aperture 222 in the center of the figure. In this aperture a gate oxide 125 of thickness 12 nm is grown that will be the gate oxide for select gate 120. In the same step, thermal oxides 230 and 232 are grown on the top surface of poly 220 and on the vertical poly surfaces of aperture 222, respectively. A layer of CVD polysilicon 120 has been deposited above the aperture and poly 220 that will become select gate 120. At this time, the contact patterning step shown in FIG. 10 will be performed.

Figure 5:
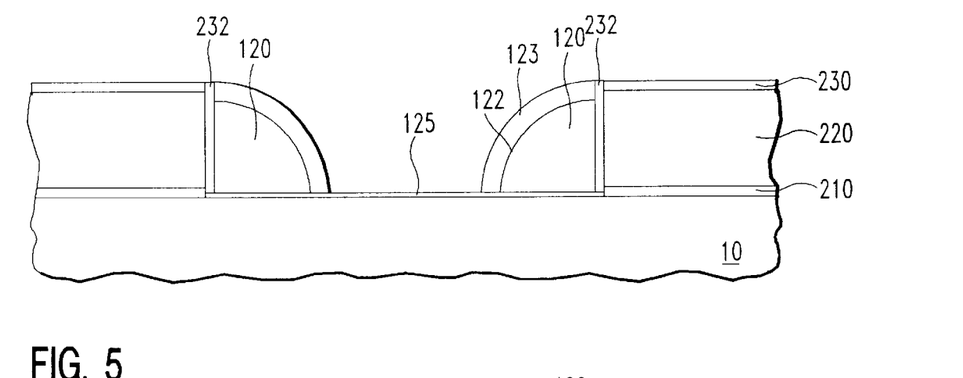

Referring now to FIG. 5, there is shown the same portion of double cell 300 after further steps of etching poly 120 in a RIE (Reactive Ion Etch) blanket etch back process to form sidewalls 120 that will be the select gate. Advantageously, poly spacer 120 is recessed below the surface of poly 220 so that the TEOS layer 125 can be formed almost conformally around it. An overetch is added after sidewall spacer 120 is formed that recesses spacer 120 below the surface of layer 230. Next, a dry thermal oxide layer 122 having a nominal thickness of 20 nm is grown on the select gates. Thermal oxide is known to have good oxide properties, such as a low density of interface states, high break-down voltage, etc. After formation of layer 122, a thicker layer of CVD TEOS (tetraethyl ortho silicate) 123 of thickness about 100 nm is deposited to provide insulation and protection for the select gate 120.

Figure 6:
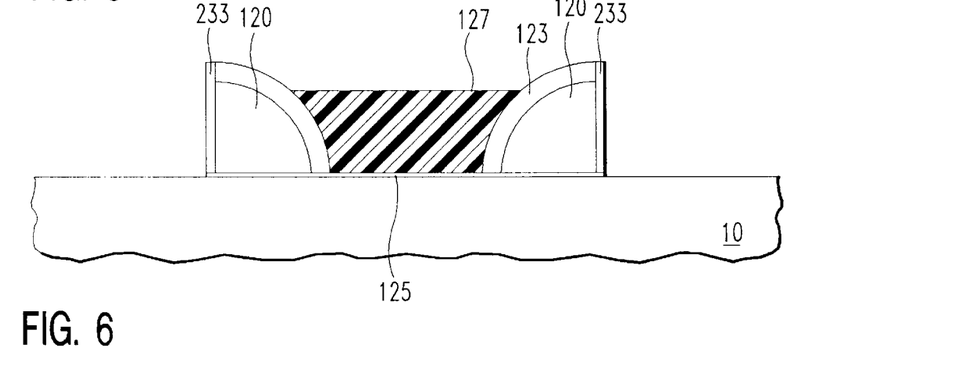

Next, as shown in FIG. 6, a layer of photoresist 127 is coated and etched back so that the only remaining photoresist is in the valley between select gates 120 on the left and right of the figure.

Figure 7:
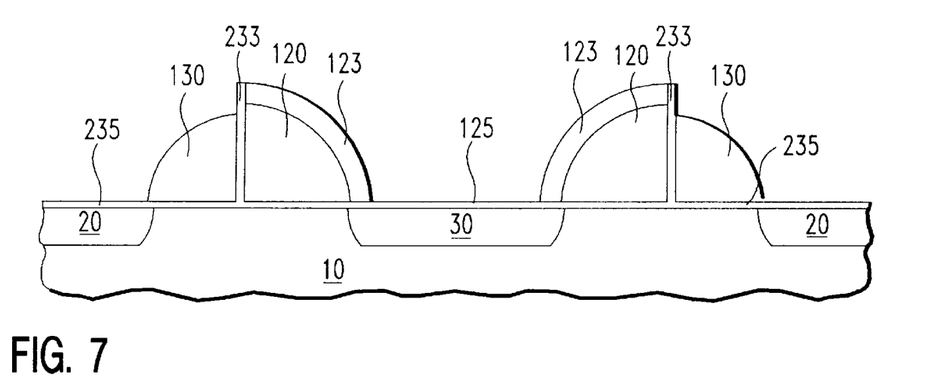
Figure 8:
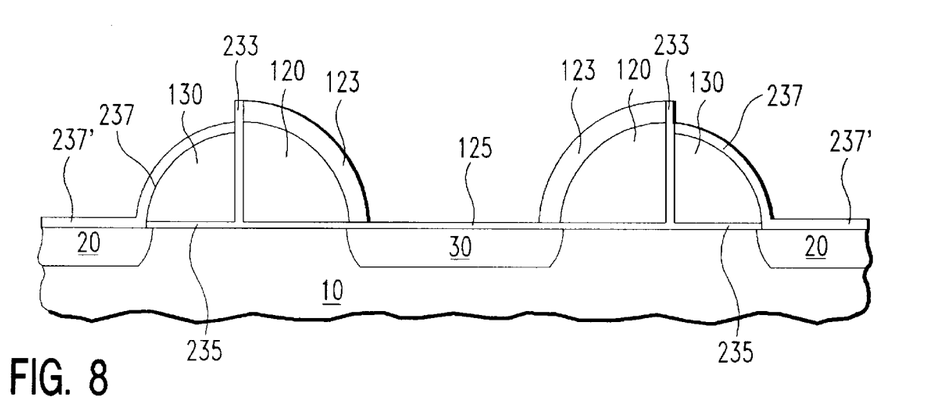

Polysilicon 220 and its associated layers are stripped away in a conventional selective wet etch or RIE process leaving only the gates 120. After stripping the remaining photoresist 127, a layer of thermal oxide is regrown on the vertical side of select gate 120 and then a CVD nitride and another oxidation process are performed to form a vertical ONO dielectric member 233 having a final thickness of about 20 nm on the vertical surface of the poly select gate 120. After the formation of vertical ONO member 233 (which will be referred to interchangeably as an insulating member or as an ONO member), and before gate 130 is formed, the horizontal surface of the silicon substrate to the right and left of the two select gates 120 is cleaned and a tunnel oxide 235 is grown to a thickness of about 6–8 nm for floating gate 130.

Then, yet another layer of polysilicon is deposited and re-etched to form polysilicon sidewalls 130 on the vertical ONO member 230 that will be trimmed to form floating gate 130 during the definition of control gate structure 140.

Figure 11A:
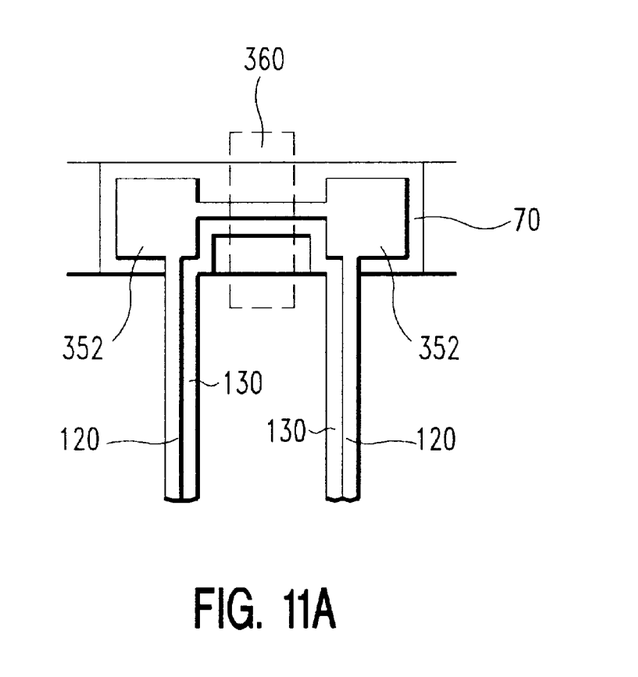
FIGS. 11A and 11B illustrate a plan view of another intermediate step.
Figure 11B:
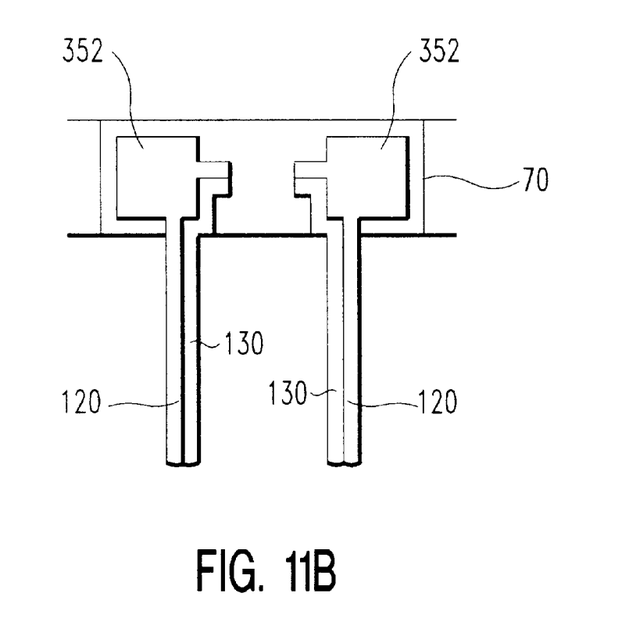

A trim mask is used to separate the select and floating gates at the end of the mesa, as shown in FIGS. 11A and 11B and discussed below. After the basic portion of the gate structure is formed, a source/drain implant having the appropriate dose and energy depending on the power supply voltage and other design parameters and generally in the range of $10^{14}$–$10^{16}$ ions/cm$^2$ are deposited to form self-aligned sources and drains in the memory cell. Next, an ONO layer 237 on floating gate 130 and 237' on the horizontal surfaces of the substrate are formed similarly to the ONO layer 233 formed as discussed with reference to FIG. 6.

Figure 9:
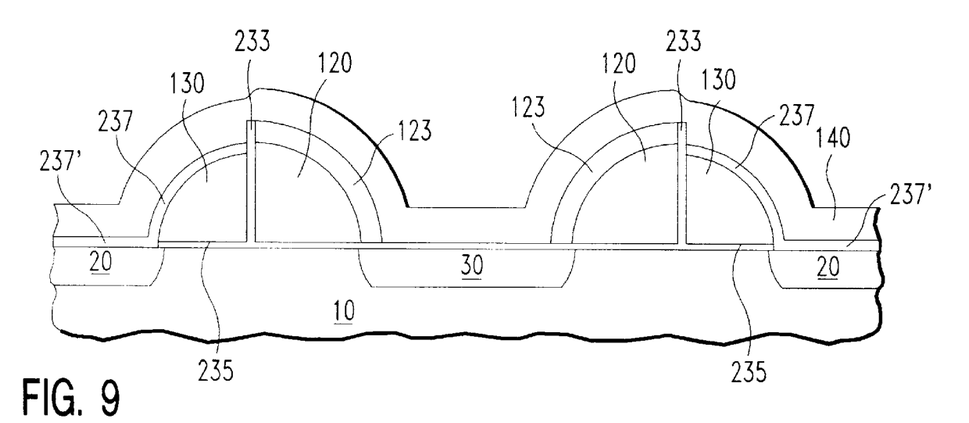

Next, in FIG. 9, a fourth layer of polysilicon 140 is deposited and patterned to form the control gate structure as shown in FIG. 2. As was discussed above, the only critical lithographic step in the process is the dimension and alignment of control gate 140 with respect to the remainder of the gate structure. As can be seen in FIGS. 1 and 2, it does not matter if control gate 140 extends over select gate 120. The reason is that TEOS layer 125 is thicker than tunnel oxide 235 and ONO 237, so that the application of a voltage on control gate 140 high enough in magnitude to program floating gate 130 does not affect select gate 120. Thus, this alignment process is relatively insensitive. Dimension 260 in FIG. 1 has a nominal value of 0.5 µm. In the embodiment illustrated, permissible tolerance on the horizontal location of gate 140 is a nominal ±0.15 µm, which is readily achievable with contemporary techniques. The patterning of control gate 140 is done with an overetch which has the effect of trimming the floating gates 130 by etching them down to the substrate or field oxide in the area between cells as shown in FIG. 3. The nominal thickness of control gate 140 is 2500Å and that of floating gate 130 is 2000Å, so that only a reasonable amount of overetch is required to eliminate floating gate 130 between the cells after control gate 140 has been patterned. An illustrative etch sequence is: first, etch control gate 140, then break through interpoly ONO 237, stopping in TEOS layer 125 and surface oxides 237' and 232 since these layers are thicker than ONO layer 237; finally, the trim etch of floating gate poly is done using a selective poly etch process.

Figure 10B:
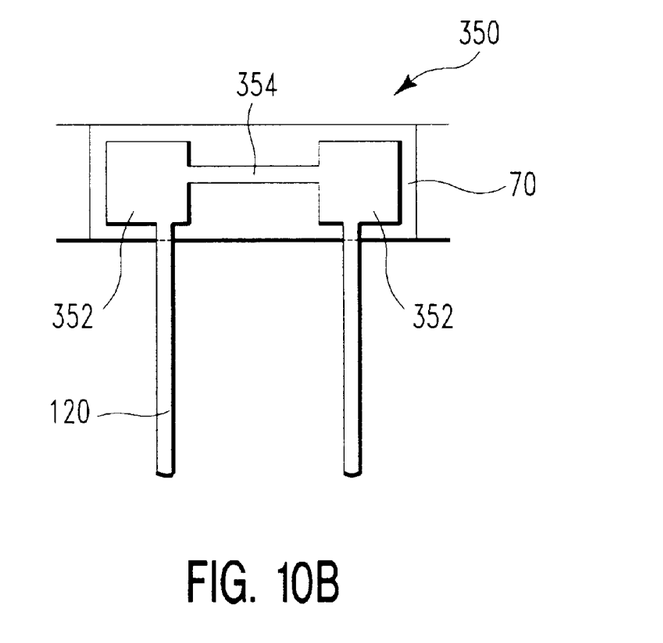

Referring now to FIGS. 10A and 10B, there is shown a step in the formation of contact pads 352, which are formed from poly layer 120. Modifying the remaining sidewall structure, that provides an unwanted link between contact pads for the select gates. These contact pads are formed in the area denoted by bracket 350 in FIG. 3. A pad formed from poly 220 has been patterned to form the rectangular island in the lower portion of FIG. 10A. Layer 120 has been put down above layer 120 in the step of forming the sidewalls for select gates 120. Protective pads 121 are formed from photoresist or any other suitable protective layer. The etching process that forms the sidewalls 120, shown extending vertically in the drawing, leaves contact pads 352 and an unwanted sidewall strip 354 that connects and shorts the contact pads 354. The rectangle labeled with the numeral 70 represents a shallow trench isolation, or a field oxide isolation that is used as support for the contact areas in order to provide isolation and an etch stop layer during pad patterning.

In FIGS. 11A and 11A, a further step of trimming the unwanted sidewalls 354 is performed after the sidewalls for floating gate 130 have been put down. A trim mask 360 is placed to expose the area between pads 352 and the composite structure 120–130 is cut.

Figure 12:
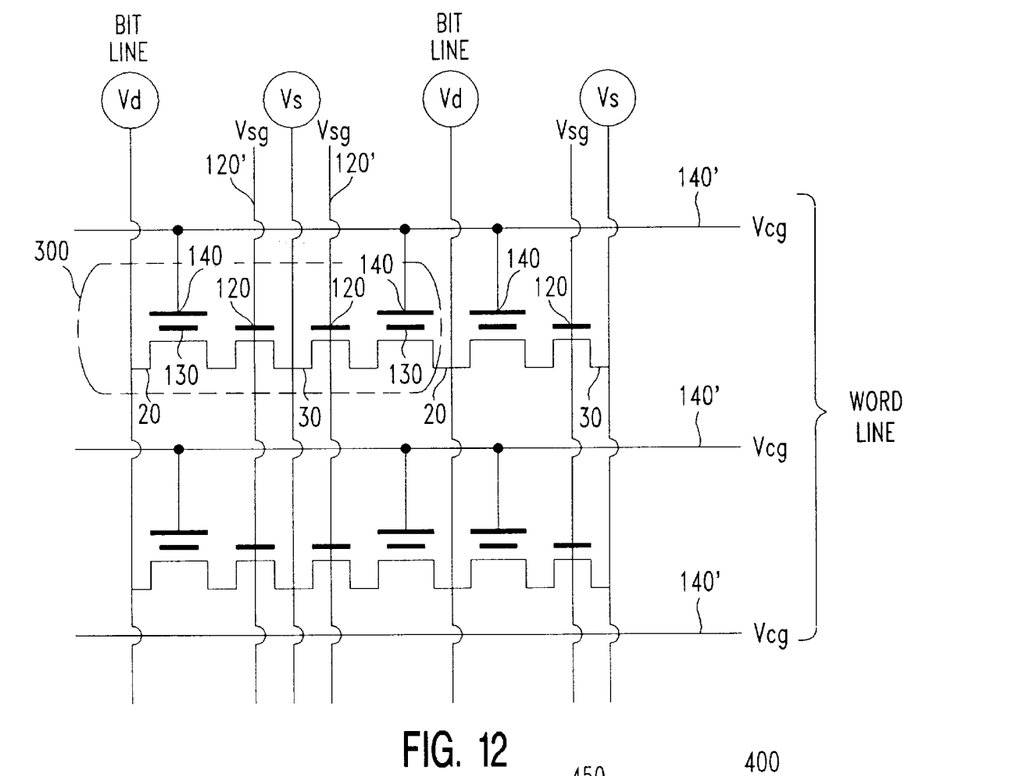
FIG. 12 illustrates a schematic circuit diagram of a portion of a memory array according to the invention.

Referring now to FIG. 12, there is shown a schematic of the same portion of the memory array as illustrated in FIG. 3, a pair of cells 300 being denoted by a dotted line. The vertical lines labeled $V_d$ and $V_s$ are connections to the sources and drains of the memory cells. The sources and drains will extend continuously in the substrate as denoted by the brackets in FIG. 3. There may be metal or polysilicon lines above the drains and extending down to the substrate to provide bit line contact. The sources do not carry signals, and are illustratively grounded in common to the substrate.

The control lines for the select gates, labeled $V_{sg}$ and denoted with the numeral 120', connect to the select gates denoted with a conventional gate symbol and the numeral 120. In the schematic representation, two different symbols are used, a line and a gate, to illustrate what is one continuous strip of polysilicon sidewall in the actual structure.

Similarly, control gate 140 and floating gate 130 are shown with conventional horizontal line symbols and a horizontal line labelled $V_{cg}$ 140' are used for word lines. The bit lines for the memory array are the wires that connect to the drains of the cells, separating adjacent 2-transistor cells. The word lines of the memory array are the control gate interconnection lines 140'. The common source can be a diffusion strip that contacts the substrate.

Figure 13:
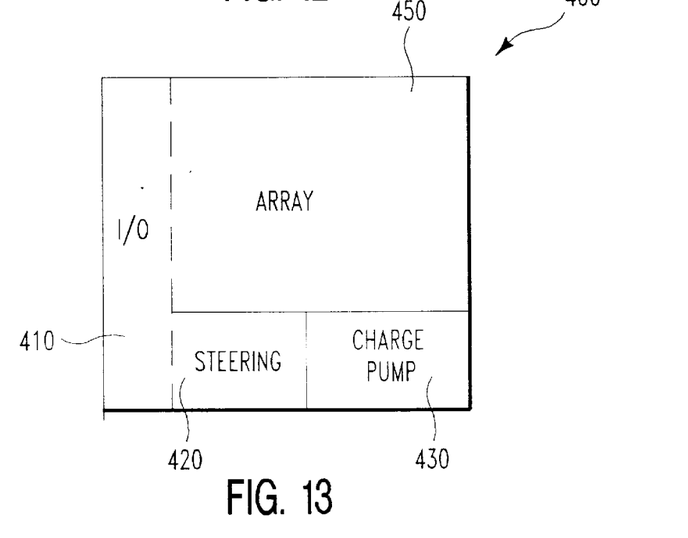
FIG. 13 illustrates an overall view of an integrated circuit memory chip constructed according to the invention.

Referring now to FIG. 13, there is shown a schematic representation of in integrated circuit EEPROM 400 constructed according to the invention, in which input/output circuits 410, high voltage steering circuits 420 and charge pump 430 perform their conventional functions. Charge pump 430 enables the circuit to be five volt only (or less) by generating the necessary high voltage (10V) to perform write and erase operations. High voltage circuits 420 represent transistors made sufficiently robust in a conventional fashion to handle the +10V and −10V used for programming and erasure.

In the programming sequence, select gate 120 is biased slightly above threshold and control gate 140 is biased at the high voltage (10V). Hot electrons from the channel are injected from the source into floating gate 130. Typical parameters are: $V_s$=0.0V, $V_d$=5.0V, $V_{sg}$=1.5V, and $V_{cg}$=10.0V.

In the erase sequence, Fowler-Nordheim tunneling through the tunnel oxide 235 is used with parameters: $V_s$=0.0V, $V_d$=5.0V, $V_{sg}$=0.0V, and $V_{cg}$=−10.0V.

With 8 nm of tunneling oxide and 10 nm for the select gate oxide, a nominal 100 $\mu$Å of read current will be available for a 3V gate voltage and for conventional process parameters and 0.5 $\mu$m design rules. Higher read currents (and corresponding faster operation) will be obtained for a 5V gate voltage. Typical read parameters are: $V_s$=0.0V, $V_d$=1.5V, $V_{sg}$=5.0V, and $V_{cg}$=5.0V.

Those skilled in the art will readily be able to modify the embodiment disclosed, and the scope of the following claims are not meant to be confined to the embodiment illustrated herein.

What is claimed is:

1. An EEPROM cell comprising a dual-gate transistor having a select gate, a floating gate and a control gate disposed on top of the floating gate, said gates being disposed above a channel and between a source and drain, said select gate being separated vertically from said channel by a gate oxide, said floating gate being separated vertically from said channel by a tunnel oxide and said control gate being separated vertically from said floating gate by a second layer of insulator; characterized in that:

said select and floating gates are each formed from polysilicon sidewalls and are separated horizontally by a thin vertical insulating member;

said select gate is disposed adjacent said source and said floating gate is disposed adjacent said drain; and said control gate extends over at least a portion of said select gate and said select gate is separated vertically from said control gate by a first predetermined dielectric layer and said floating gate is separated from said control gate by a second predetermined dielectric layer, said gate oxide and said first dielectric layer and said tunnel oxide and said second dielectric layer being related such that a predetermined program voltage on said control gate sufficient to cause electrons to tunnel through said tunnel oxide between said channel and said floating gate is insufficient to cause electrons to tunnel through said gate oxide.

2. An EEPROM cell according to claim 1, further characterized in that:

said select gate has a vertical face abutting said vertical insulating member and a second face opposite said vertical face;

said floating gate has a vertical face abutting said vertical insulating member and a second face opposite said vertical face; and said control gate extends over at least a predetermined portion of said floating gate.

3. An integrated circuit EEPROM comprising:

input/output means for passing data into and out from said EEPROM;

voltage generating means for generating a predetermined program voltage;

voltage steering means for directing said program voltage along predetermined program paths in said circuit; and a memory array comprising:

a set of dual-gate field effect transistor memory cells, each dual-gate transistor comprising a select gate, a control gate and a floating gate disposed above a channel and between said common source and a drain, said select gate being separated vertically from said channel by a gate oxide, said floating gate being separated vertically from said channel by a tunnel oxide and said control rate being separated vertically from said floating gate by a second layer of insulator, characterized in that:

said select and floating gates are each formed from polysilicon sidewalls having a vertical side and are separated horizontally by a thin vertical insulating member adjacent said vertical side of said select and floating gates said select gate is disposed adjacent said source and said floating gate is disposed adjacent said drain; and said control gate extends over at least a portion of said select gate and said select gate is separated vertically from said control gate by a first predetermined dielectric layer and said floating gate is separated from said control gate by a second predetermined dielectric layer, said gate oxide and said first dielectric layer and said tunnel oxide and said second dielectric layer being related such that a predetermined program voltage on said control gate sufficient to cause electrons to tunnel through said tunnel oxide between said channel and said floating gate is insufficient to cause electrons to tunnel through said gate oxide.

4. An EEPROM according to claim 3, in which said cells are arranged in pairs of cells sharing a common source; and said select gates are disposed between said common source and said floating gates of said cells, whereby said cells are mirror images of one another.

5. An EEPROM according to claim 4, in which said drains of said cells are the bit lines of said EEPROM and a set of interconnection members connecting said control gates are the word lines of said EEPROM.

6. An integrated circuit EEPROM comprising:

input/output means for passing data into and out from said EEPROM;

voltage generating means for generating a predetermined program voltage;

voltage steering means for directing said program voltage along predetermined program paths in said circuit; and a memory array comprising;

a set of dual-gate field effect transistor memory cells, each dual-gate transistor comprising a select gate, a control gate and a floating gate disposed above a channel and between said common source and a drain, said select gate being separated vertically from said channel by a gate oxide, said floating gate being separated vertically from said channel by a tunnel oxide and said control gate being separated vertically from said floating gate by a second layer of insulator, characterized in that:

said select and floating gates are each formed from polysilicon sidewalls having a vertical side and are separated horizontally by a thin vertical insulating member adjacent said vertical side of said select and floating gates;

said bit lines extend throughout said memory array to a set of bit line contacts disposed above an insulating layer, hereby signals travelling along said bit lines pass through said set of bit lines contacts; and in which said bit line contacts are extensions of said select gates and formed from the same material.

* * * * *